United States Patent [19]
Isaksson et al.

[11] Patent Number: 6,111,903
[45] Date of Patent: Aug. 29, 2000

[54] OPTICAL SOURCE WITH MONITOR

[75] Inventors: Jan Isaksson, Taby; Michael Widman, Kangsansen, both of Sweden

[73] Assignee: Mitel Semiconductor AB, Canada

[21] Appl. No.: 09/103,723

[22] Filed: Jun. 24, 1998

[30] Foreign Application Priority Data

Jun. 28, 1997 [GB] United Kingdom .................... 9713607

[51] Int. Cl.[7] ................................ H01S 5/00; H01S 3/00; H01S 3/04
[52] U.S. Cl. .................................. 372/43; 372/33; 372/36
[58] Field of Search .................................. 372/43, 36, 33, 372/50

[56] References Cited

U.S. PATENT DOCUMENTS

| | | |
|---|---|---|
| 5,198,916 | 3/1993 | Kim . |
| 5,218,611 | 6/1993 | Tanaka et al. ............................. 372/36 |
| 5,226,052 | 7/1993 | Tanaka et al. ............................. 372/36 |
| 5,247,167 | 9/1993 | Bargerhuff et al. . |
| 5,367,530 | 11/1994 | Noishiki et al. .......................... 372/43 |

FOREIGN PATENT DOCUMENTS

| | | |
|---|---|---|
| 5-144074 | 6/1993 | Japan . |
| 8-161766 | 6/1996 | Japan . |

Primary Examiner—Teresa M. Arroyo
Assistant Examiner—Quyen P. Leung
Attorney, Agent, or Firm—Laubscher & Labscher

[57] ABSTRACT

An optical emission device includes a laser source having an emitting surface, and a sensor laterally adjacent the laser source generating an output signal dependent on the amount of light falling on its detection surface. A transparent waveguide is located in front of the emitting surface and extends generally parallel thereto such that light striking the waveguide in a direction normal to the emitting surface passes straight through the waveguide. A coupling medium is placed between the emitting surface and the waveguide. A light dispersant in the coupling medium causes a fraction of the laser light to strike the waveguide at an oblique angle so that it can enter the waveguide and be carried thereby to the sensor. An important advantage of the invention is that is uses inexpensive passive parts. The assembly process easy to implement, and the parts are stable during temperature changes. As a result only a small tracking error occurs.

18 Claims, 1 Drawing Sheet

OPTICAL SOURCE WITH MONITOR

FIELD OF THE INVENTION

This invention relates to generally to the field of optics, and more particularly to an optical emission device, typically a laser diode, with an arrangement for monitoring the output of the device.

BACKGROUND OF THE INVENTION

In laser diodes, a photodiode is often used to measure the emitted light and feed this information back to the current source feeding the laser diode. The feedback signal is used to adapt the operating current in a way that enables the laser light to stay within a desired dynamic window. This arrangement is called a laser diode with a monitoring photodiode.

In the case of edge-emitting laser diodes, it is known to monitor the light output of the diode by placing a photodiode directly on the backside laser beam. This is possible because an edge-emitting laser diode emits light through both its front and rear mirrors. The monitoring photodiode is placed adjacent the rear mirror and does not disturb the useful emission from the front mirror.

Recently, there has been a trend in the art to replace edge-emitting diodes by vertical cavity surface emitting laser diodes (VCSELs). In a VCSEL, the rear mirror is embedded inside the laser die and a result the only accessible light is that emitted through the front mirror at the top of the die. Some means must be provided of tapping off some of the useful light off for use as a monitor signal. A traditional method of coupling light from the front surface of the VCSEL to the monitoring photodiode is to use two mirrors, one placed in front of the VCSEL and the other in front of the photodiode, each at a 45° angle to the beam. The mirror in front of the VCSEL is semitransparent. This arrangement has the disadvantage of being complicated to assemble and results in a device with an inherent tracking error due to the use of discrete passive parts, i.e. the mirrors and the means to fix the mirrors.

SUMMARY OF THE INVENTION

An object of the invention is to alleviate this problem.

According to the present invention there is provided an optical emission device comprising a laser source having an emitting surface, a sensor laterally adjacent said laser source generating an output signal dependent on the amount of light falling on a detection surface thereof, a transparent waveguide in front of said emitting surface and extending generally parallel thereto such that light striking said waveguide in a direction normal to said emitting surface passes straight through said waveguide, a coupling medium between said emitting surface and said waveguide, and a light dispersant in said coupling medium to cause a fraction of the laser light to strike said waveguide at an oblique angle so that it can enter said waveguide and be carried thereby to said sensor.

The transparent waveguide is typically a glass plate and the coupling medium may be a suitable glue containing, for example, small dielectric spheres, typically $SiO_2$, having a slightly different refractive index from the glue. The sensor is typically a photodiode. The waveguide could also made of rigid plastic, or could, for example, be a plastic film.

In this specification, when reference is made to the terms laser or light, it will be understood by one skilled in the art that it is not intended to limit the scope of the invention to the visible spectrum.

The invention thus permits a portion of the light to be tapped from the useful laser emission and coupled into the photodiode without impairing the properties of the device and without requiring complex assembly as in the prior art.

The device is typically a vertical cavity surface emitting laser diode.

It will thus be appreciated that the glass plate and transparent glue containing a filler serve to couple a fraction of the laser light to the photodiode without deteriorating the laser beam properties. The photodiode is normally placed in the same reference plane as the laser diode and as close to the laser diode as possible.

The photodiode and the laser diode face the same direction, which is normal to the reference plane. The surface of that piece of glass shall be parallel to the reference plane. The glue covering the laser diode is transparent to the laser light and contains a filler that consists of dielectric spheres with a refractive index slightly different from the refractive index of the glue. As a result of light scattering by the filler, a fraction of the laser light will be spread over larger angles inside the glue. Some of the spread light will be guided by the piece of glass by total internal reflection at the glass/air interface and that light will be carried over to the photodiode.

The invention also extends to a method of controlling a laser diode comprising the steps of placing a transparent waveguide in front of an emitting surface thereof such that said waveguide extends generally parallel to said emitting surface, providing a light dispersant between said emitting surface and said waveguide such that a fraction of the laser light strikes said waveguide at an oblique angle and is tapped off into said waveguide, and monitoring the output of said laser diode by sensing the amount of light tapped off into said waveguide.

BRIEF DESCRIPTION OF THE DRAWINGS

The invention will now be described in more detail, by way of example, only with reference to the accompanying drawings, in which.

DESCRIPTION OF THE PREFERRED EMBODIMENTS

Figure 1:
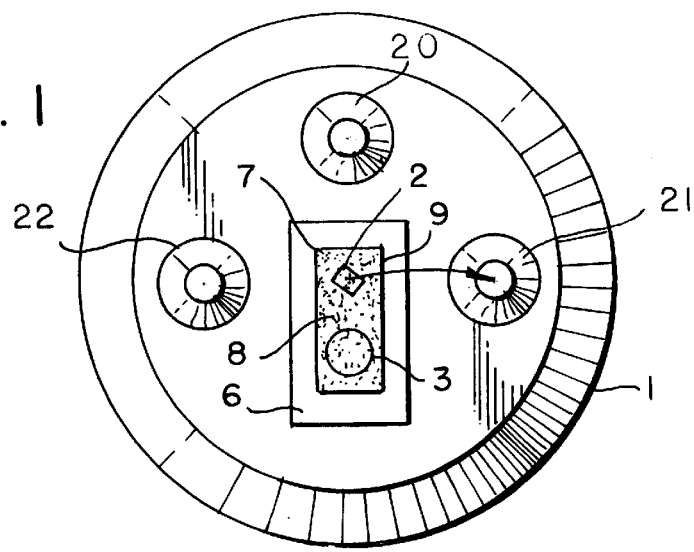
FIG. 1 is a plan view of a VCSEL device embodying the invention with the cap removed.
Figure 2:
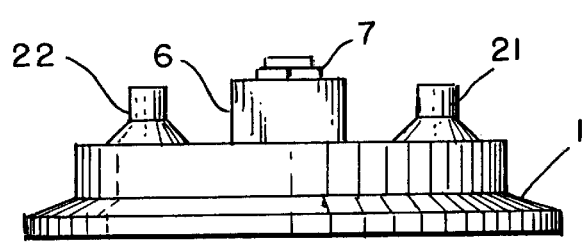
FIG. 2 is a side elevation of the device shown in FIG. 1.
Figure 3:
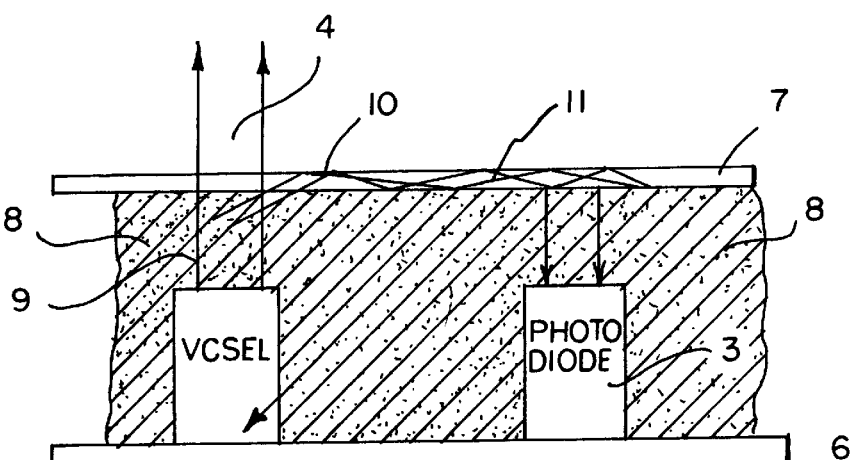
FIG. 3 is a block diagram showing the of the paths of the light rays.

Referring now to FIGS. 1 and 2, the device comprises a base 1 on which is mounted a pedestal 6 supporting VCSEL laser diode 2 and a photodiode 3, which is mounted laterally adjacent the laser diode 2. Bonding posts 20, 21, 22 are provided on the pedestal 6 in a manner known per se. As shown in FIG. 3, the laser diode 2 emits a laser beam 4 in a direction normal to its emitting surface 5.

A rectangular strip of window glass 7 having a refractive index of 1.5 and about 100 microns thick is placed over the laser diode 2 and photodiode 3 so as to be parallel to the emitting surface 5 of the laser diode 2. The glass strip 7 serves as a waveguide in a manner that will be explained in more detail below.

The glass plate 7 is held in place by a filler glue 8, which serves as a coupling medium between the laser diode 2 and the glass plate 7 and between the photodiode 3 and the plate 7. The glue 8 is typically EPOTEK 301™, which has a refractive index of 1.5. The glue 8 typically fills the whole cavity between the pedestal 6 and the glass plate 7.

At least in the space between the diode 2 and the glass plate 7, the filler glue 8 contains small $SiO_2$ spheres with a refractive index of 1.45, which is different from that of the filler glue 8. The $SiO_2$ spheres are in the form of a power sold under the name AEROSIL. The glue 8 is filled with the powder to a suitable consistency. The spheres can extend throughout the whole mass of glue 8.

Since the filler glue 8 has the same refractive index as the glass plate 7, the laser beam 4 striking the glass plate 7 normal to its surface passes straight through unaffected. The effect of the spheres 9 is to scatter a small portion of the laser light so that it strikes the glass plate 7 at an oblique angle. This is shown diagrammatically in FIG. 3, where rays 10 reflected off spheres 9 strike the plate 7 at angles α, β. These rays then propagate through the glass plate 7 over to the photodiode 3 by total internal reflection. The amount of light scattered depends on the amount of $SiO_2$ powder present and this can be varied to suit any particular requirements.

A portion of these rays then escapes into the filler glue 8 above the photodiode 3, which produces an output signal based on the intensity of light received.

It will be seen that the invention thus provides a way of tapping of a portion of the laser light in a VCSEL for monitoring purposes without interfering with the operation of the laser.

An important advantage of the invention is that is uses passive parts, and the strip of glass, the glue and the filler, are inexpensive. The assembly process easy to implement, and the parts are stable during temperature changes. As a result only a small tracking error occurs.

Variations of the invention may contain other active parts than as vertical cavity surface emitting laser and a photodiode. The light source may be an light emitting diode and the photodiode may be replaced by any photosensitive device.

We claim:

1. An optical emission device comprising a laser source having an emitting surface, a sensor laterally adjacent said laser source generating an output signal dependent on the amount of light falling on a detection surface thereof, a transparent waveguide in front of said emitting surface and extending generally parallel thereto such that light striking said waveguide in a direction normal to said emitting surface passes straight through said waveguide, a coupling medium between said emitting surface and said waveguide, and a light dispersant in said coupling medium to cause a fraction of the laser light to strike said waveguide at an oblique angle so that it can enter said waveguide and be carried thereby to said sensor.

2. An optical emission device as claimed in claim 1, wherein said transparent waveguide comprises a rigid plate.

3. An optical emission device as claimed in claim 2, wherein said rigid plate is a glass plate.

4. An optical emission device as claimed in claim 3, wherein said glass plate has a thickness of about 100 microns and a refractive index of about 1.5.

5. A optical emission device as claimed in claim 1, wherein said dispersant comprises spheres having a different refractive index from said coupling medium.

6. A optical emission device as claimed in claim 5, wherein said spheres are silicon dioxide spheres with a refractive index of about 1.45.

7. A optical emission device as claimed in claim 1, wherein said coupling medium comprises a glue.

8. A optical emission device as claimed in claim 6, wherein said glue has a refractive index of about 1.5.

9. An optical emission device as claimed in claim 1, wherein said laser source is a laser diode.

10. An optical emission device as claimed claim 9, wherein said laser diode is a vertical cavity surface emitting laser diode.

11. An optical emission device as claimed claim 10, wherein said sensor is a photodiode.

12. A method of controlling a laser diode comprising the steps of placing a transparent waveguide in front of an emitting surface thereof such that said waveguide extends generally parallel to said emitting surface, providing a light dispersant between said emitting surface and said waveguide such that a fraction of the laser light strikes said waveguide at an oblique angle and is tapped off into said waveguide, and monitoring the output of said laser diode by sensing the amount of light tapped off into said waveguide.

13. A method as claimed in claim 12, wherein said transparent waveguide is in the form a rigid plate.

14. A method as claimed in claim 13, wherein said rigid plate is a glass plate.

15. A method device as claimed in claim 12, wherein said dispersant comprises spheres having a different refractive index from said coupling medium.

16. A method as claimed in claim 15, wherein said spheres are silicon dioxide spheres with a refractive index of about 1.45.

17. A method as claimed in claim 12, wherein said dispersant is provided in a glue acting as coupling medium.

18. A method as claimed in claim 17, wherein said glue has a refractive index of about 1.5.

* * * * *